United States Patent [19]
Beck et al.

[11] Patent Number: 6,133,759
[45] Date of Patent: Oct. 17, 2000

[54] DECOUPLED RESET DYNAMIC LOGIC CIRCUIT

[75] Inventors: John Andrew Beck; Robert Paul Masleid, both of Austin; Thomas Robert Toms, Dripping Springs, all of Tex.

[73] Assignee: International Business Machines Corp., Armonk, N.Y.

[21] Appl. No.: 09/097,794

[22] Filed: Jun. 16, 1998

[51] Int. Cl.[7] .............................................. H03K 19/0948
[52] U.S. Cl. ................................ 326/98; 326/27; 326/121
[58] Field of Search ................................ 326/93, 95, 98, 326/112, 119, 121, 27–28

[56] References Cited

U.S. PATENT DOCUMENTS

| | | | |
|---|---|---|---|
| 4,401,903 | 8/1983 | Iizuka | 326/98 |
| 5,208,489 | 5/1993 | Houston | 326/98 |
| 5,541,537 | 7/1996 | Kim et al. | 326/121 |
| 5,831,452 | 11/1998 | Nowak et al. | 326/98 |
| 5,841,300 | 11/1998 | Murabayashi et al. | 326/98 |

OTHER PUBLICATIONS

Horenstein, Mark. Microelectronic Circuits & Devices. Prentice–Hall, pp. 723–725, 1990.

Primary Examiner—Jon Santamauro
Attorney, Agent, or Firm—Barry S. Newberger; Winstead Sechrest & Minick P.C.; Anthony V. S. England

[57] ABSTRACT

A dynamic logic circuit is implemented which decouples the reset of the output from the reset of the evaluation node. An N-tree logic circuit generates a logical output signal in response to a first set of input signals. The output signal is coupled to a gate of a first n-type field effect transistor (NFET) of a parallel coupled pair of NFET devices. The parallel drains are coupled to an output of the dynamic logic circuit and the parallel sources are coupled to ground. The gate of the second NFET device of the pair is coupled to the junction of a source and drain, respectively, of a series connected p-type field effect transistor (PFET) device, and a third NFET device. The third NFET device has a source coupled to ground, and the PFET device has a drain coupled to a voltage supply. Gates of the PFET device and the third NFET device are connected together and receive a logic signal whereby the output of the dynamic logic circuit may be reset.

11 Claims, 8 Drawing Sheets

DECOUPLED RESET DYNAMIC LOGIC CIRCUIT

TECHNICAL FIELD

The present invention relates in general to logic circuitry, and in particular, to metal-oxide semiconductor (MOS) dynamic logic circuits.

BACKGROUND INFORMATION

Dynamic logic circuits of the domino type, according to the prior art, use pre-charging circuits on an evaluation node to reset the circuit's output. Referring to FIG. 1, dynamic logic circuit 100 in accordance with the prior art is shown. Dynamic logic circuit 100 includes N-tree logic 101 which performs a logical calculation in response to input signals 102–106. The logical calculation is implemented by an N-tree stack, including NFET devices 107–111 in dynamic logic circuit 100. Each of input signals 102–106 is coupled to a corresponding gate of NFET devices 107–111.

The logical calculation is performed during an evaluate phase of clock 112. In its evaluate phase, clock 112 turns off p-type field effect transistor (PFET) device 113 and turns on a foot transistor, n-type field effect transistor (NFET) device 114. The output of N-tree logic 101 appears on evaluation node "N". The signal on evaluation node "N" is inverted at an output 115 of dynamic logic circuit 100 by PFET device 116 and NFET device 117. PFET device 118 forms a half latch that maintains the logic state on evaluation node "N" when it is precharged to a "high" logic level.

Prior to evaluation, evaluation node "N" is pre-charged during a pre-charge phase of clock 112. The pre-charge phase of clock 112 turns on PFET device 113 coupling evaluation node "N" to a voltage supply. Substantially simultaneously, NFET device 114 is turned off, decoupling a "foot" node of N-tree logic 101 from ground. The coupling of node "N" to the voltage supply resets output 115 by turning on NFET device 117 thereby discharging output 115 by coupling output 115 to ground.

Thus, in dynamic logic circuit 100 in accordance with the prior art, the reset of output 115 is through the evaluation path. In other words, the dynamic logic circuit 100 reset and evaluation paths are coupled, and an increase in the evaluation path load on the evaluation node adversely affects the reset timing. Conversely, any increase in the reset path sizing detrimentally affects the evaluation path timing.

Thus, there is a need in the art for a reset mechanism that decouples the reset of the dynamic logic circuit from the evaluation path, and which permits improved circuit performance for a wide range of sizing, output loading, and noise requirements. Although dynamic logic 100 has been illustrated to be of the footed type, dynamic logic circuits of the delayed reset, and pseudo-clocked types, in accordance with the prior art, behave in substantially the same way during pre-charge and evaluate phases. Therefore, there is a need for a decoupled reset mechanism in dynamic logic circuits of these types as well.

SUMMARY OF THE INVENTION

The aforementioned needs are addressed by the dynamic logic circuit of the present invention. An N-tree logic circuit generates an output logical signal in response to a plurality of inputted first logical signals. The logical signal output of the N-tree logic circuit is coupled to a gate of a first n-type field effect transistor (NFET) device thereby controlling the switching of the NFET device. A second NFET device is coupled in parallel with the first NFET device, sources being coupled to ground and drains coupled to an output of the dynamic logic circuit. A gate of the second NFET device is coupled to the junction formed by a source and drain of a series connected third NFET device and p-type field effect transistor (PFET) device. A drain of the PFET device is connected to the voltage supply and the source of the third NFET device is coupled to ground. Gates of the third NFET device and the PFET device receive a second logical signal, whereby the output of the dynamic logic circuit may be reset.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
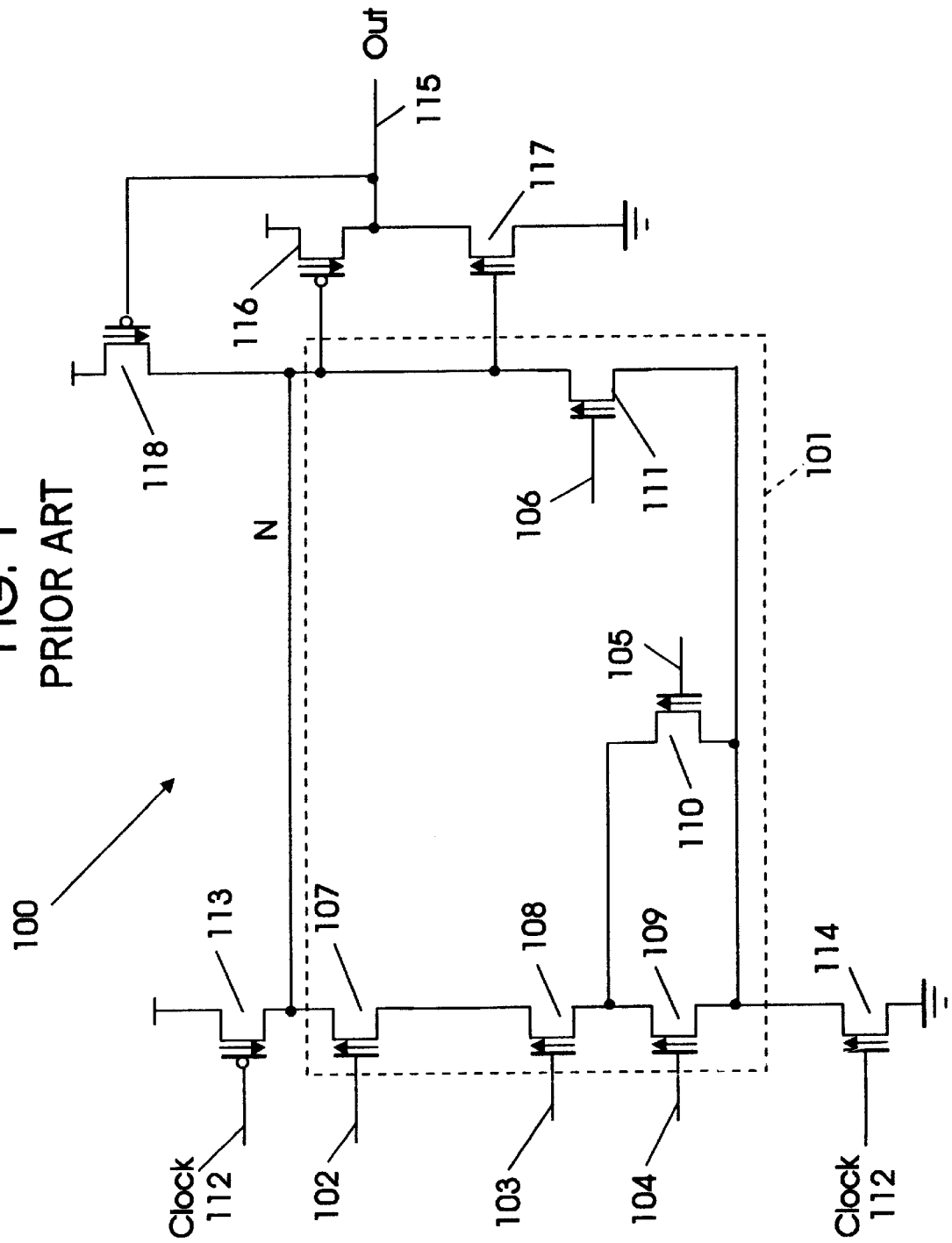
FIG. 1 illustrates, in schematic form, a dynamic logic circuit in accordance with the prior art.

The present invention provides dynamic logic circuitry in which the output reset is decoupled from the reset of the evaluation node. This allows the internal evaluation node to reset more slowly permitting smaller PFET devices to perform the reset function of the evaluation node. This lowers the capacitance on the evaluation node. The large reset NFET in the output circuit is also removed from the evaluation node, in accordance with the principles of the present invention. Therefore, evaluation node transitions, either high to low or low to high, are less susceptible to speed reduction by the load represented by the output NFET device.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Refer now to the drawings wherein depicted elements are not necessarily shown to scale and wherein like or similar elements are designated by the same reference numeral through the several views.

Figure 2:
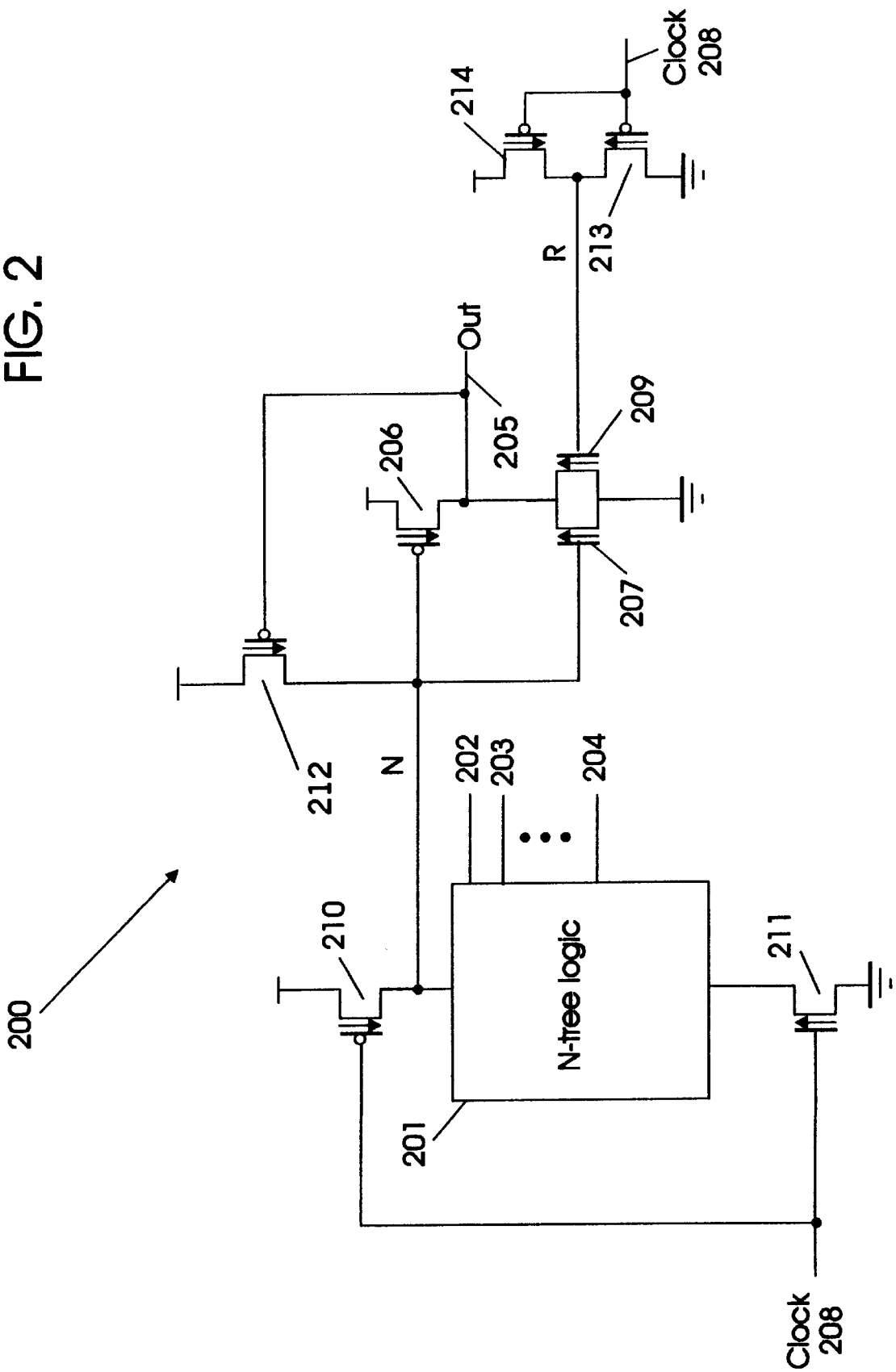
FIG. 2 illustrates, in schematic form, a dynamic logic circuit in accordance with an embodiment of the present invention.

FIG. 2 illustrates decoupled reset dynamic logic circuit 200 according to the principles of the present invention. Dynamic logic circuit 200 includes N-tree logic 201 which receives a plurality of logical input signals 202–204. N-tree logic 201 includes an NFET stack (not shown in FIG. 2) which receives input signals 202–204, and performs a logical calculation in response to the logical values represented by signals 202–204. The result of the logical calculation appears at an output of N-tree logic 201 coupled to evaluation node "N". The signal on evaluation node "N" is inverted to form output 205 of dynamic logic 200.

The inversion of the output of the evaluation node state to form output 205 occurs through the action of PFET device 206 and NFET device 207. If node "N" evaluates "high", then it retains a pre-charge placed on the node during a precharge phase, to be discussed, of clock 208. Evaluation node "N" is coupled in parallel to gates of PFET device 206 and NFET device 207, thereby turning off PFET device 206 and turning on NFET device 207.

However, NFET device 207, in accordance with the principles of the present invention, does not need to discharge output 205. Output 205 has previously been discharged during reset via NFET device 209. Reset of output 205 will be discussed below. Therefore, NFET device 207 need only be sufficiently wide such that it clamps an output voltage $V_{OUT}$ such that $V_{OUT}$ remains less than $V_{TH}$, where $V_{TH}$ is the noise threshold voltage for NFET devices in succeeding dynamic logic stages (not shown) coupled to output 205 of dynamic logic 200. In other words, NFET device 207 may be sized in order to satisfy noise requirements independent of reset time requirements imposed on output 205.

If node "N" evaluates "low", then output 205 transitions from "low" to "high". NFET device 207 is turned off, and PFET device 206 is turned on, coupling output 205 to a voltage source. The sizing of NFET device 207 is not constrained in this case.

Conversely, if node "N" evaluates "high" it retains a pre-charge supplied it during a pre-charge phase of clock 208. Then NFET device need only clamp output 205 such that the previously described noise constraint is satisfied.

In the pre-charge phase, PFET device 210 turns on, coupling node "N" to the voltage source. The pre-charge phase of clock 208 also turns off a foot transistor, NFET device 211. The turning off of NFET device 211 decouples a "foot" of N-tree logic 201 from ground. The pre-charge on node "N" turns off PFET device 206, and turns on NFET device 207. Thus, output 205 tends toward reset by the turning on of NFET device 207.

However, in accordance with the principles of the present invention, clock 208 is also provided to a pair of transistors, NFET device 213 and PFET device 214. PFET device 214 and NFET device 213 are coupled in series with a drain of PFET device 214 coupled to a voltage supply, and a source of NFET device 213 coupled to ground. The common node between NFET device 213 and PFET device 214 is coupled to a gate of NFET device 209, the drain of which is coupled to output node 205. During pre-charge, NFET device 213 is turned off and PFET device 214 is turned on, coupling their common node, "R", and, thereby, the gate of NFET device 209 to a voltage supply. Thus, NFET device 209 is turned on, also discharging output 205.

The desired reset time of output node 205 may be attained by adjusting the width of NFET device 209. The reset time of output node 205 may be reduced by increasing the width of NFET device 209, independent of the width of NFET device 207, which is in the evaluation path. Thus, according to the principles of the present invention, the reset of output node of dynamic logic 200 may be decoupled from the evaluation node "N".

Then, when node "N" evaluates "high" during the evaluation phase of clock 208, the width of NFET device 207 only need be sufficient to maintain output 205 voltage, $V_{OUT}$, less than the noise threshold voltage, $V_{TH}$, of the NFET devices in a succeeding logic circuit (not shown), as previously described. That is, the width of NFET device 207 need only be sufficient to satisfy the aforementioned noise constraint.

Dynamic logic circuit 200, in FIG. 2, is of the "footed" type with an inverter output stage. The principles of the present invention also apply to other types of dynamic logic circuits as well.

Figure 3:
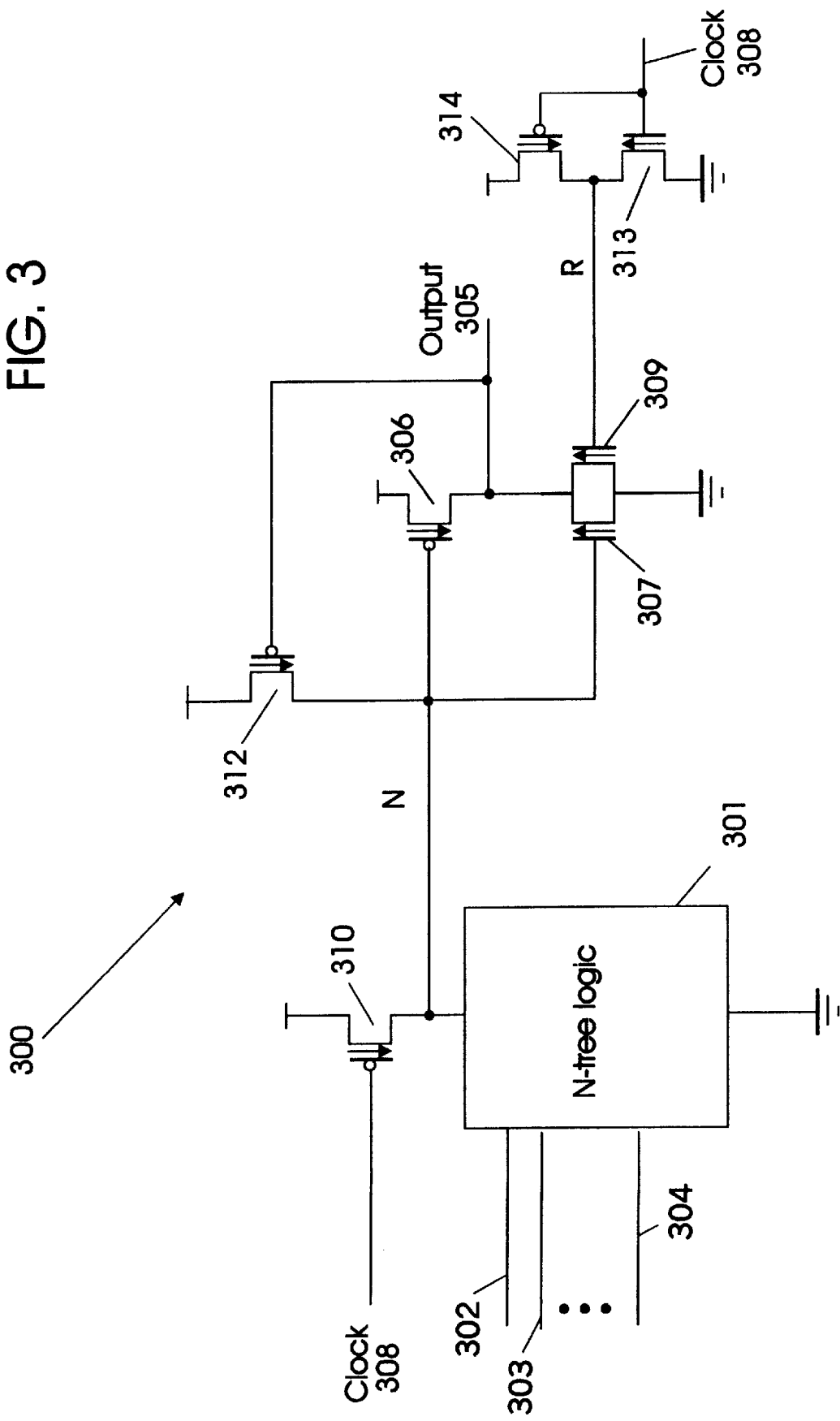
FIG. 3 illustrates, in schematic form, a dynamic logic circuit in accordance with an alternative embodiment of the present invention.

Refer now to FIG. 3 in which is depicted a delayed reset type decoupled reset dynamic logic circuit 300 according to the principles of the present invention. Dynamic logic circuit 300 includes N-tree logic 301 having a plurality of inputs 302–304, providing input data values to an NFET stack (not shown in FIG. 3) within N-tree logic 301. The foot of N-tree logic 301 is coupled directly to ground, in contrast to dynamic logic circuit 200 in FIG. 2 wherein the foot of N-tree logic 201 is coupled to ground through NFET device 211 in response to clock 208.

During an evaluate phase of clock 308, dynamic logic 300 operates in similar fashion to the footed dynamic logic circuit 200 in FIG. 2. If N-tree logic 301 evaluates "low", PFET device 306 is turned on coupling output 305 to a voltage supply. NFET device 307 is turned off as is PFET device 312. Clock 308 also turns off PFET device 314 and turns on NFET device 313, thereby coupling their common node, "R", which is coupled to a gate of NFET device 309, to ground. NFET device 309 is turned off.

Conversely, if N-tree logic 301 evaluates "high", output 305 is coupled to ground through NFET device 307, and PFET device 306 is turned off. As previously discussed in conjunction with FIG. 2, NFET device 307 need only have sufficient width to satisfy the noise constraint that $V_{OUT}$ is less than $V_{TH}$. Because dynamic logic 300 is in an evaluate phase of clock 308, NFET device 309 is turned off, just as in the case when node "N" evaluated "high".

In the pre-charge phase of clock 308, with node "N" having previously evaluated "low", node "N" must be pre-charged. However, because the foot of N-tree logic 301 is no longer coupled to ground through a foot transistor in dynamic logic 300, the pre-charge phase of clock 308 must be delayed until the inputs 302–304 of N-tree logic 301 are all reset. Otherwise, PFET device 310 may turn on, with pre-charge node "N" coupled through N-tree logic 301 to ground. In such a case, a large current would flow from the voltage supply through PFET 310 to ground through N-tree logic 301. Delaying the pre-charge phase of clock 308 until inputs 302–304 are reset ensures that node "N" is isolated from ground before PFET device 310 is turned on.

When the pre-charge phase of clock 308 begins, clock 308 turns off NFET device 313 and turns on PFET device 314. Node "R", which is coupled to the gate of NFET device 309, is coupled to a voltage supply, thereby turning on NFET device 309 and resetting output 305 as hereinabove described in conjunction with FIG. 2.

Figure 4:
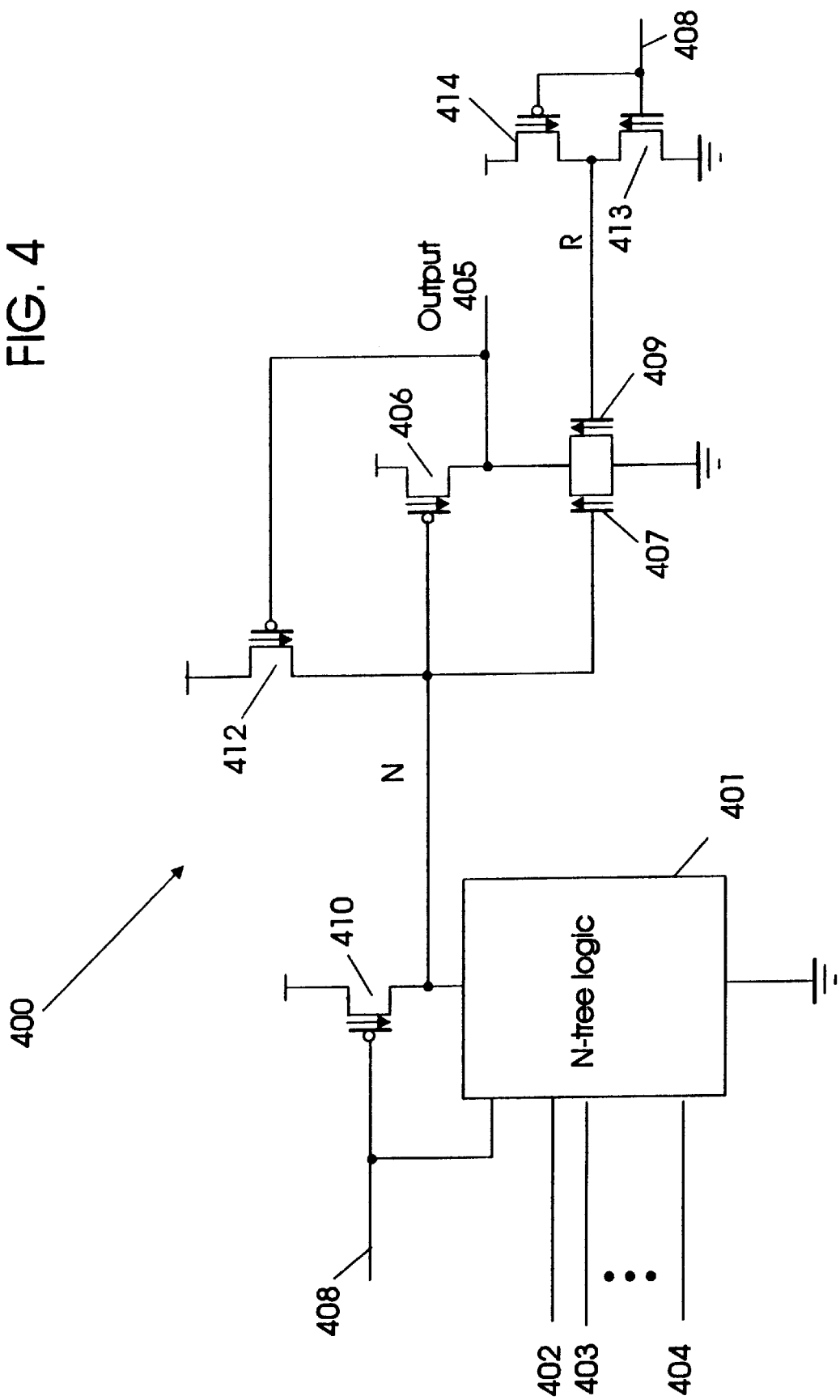
FIG. 4 illustrates, in schematic form, a dynamic logic circuit in accordance with another alternative embodiment of the present invention.

An embodiment of the present invention may also be used in dynamic logic circuits of the pseudo-clocked type. Refer now to FIG. 4 in which a pseudo-clocked dynamic logic circuit 400 according to the principles of the present invention is illustrated. Dynamic logic 400 includes N-tree logic 401 having a plurality of inputs 402–404 and 408, coupled to an N-tree stack (not shown in FIG. 4). N-tree logic 401 performs a logical calculation in response to logical signals on inputs 402–404 and 408. N-tree logic 401 is coupled to evaluation node "N". Pre-charge and evaluation are controlled at evaluation node "N" by a logic signal input, logic signal 408. Asserting logic signal 408 turns off PFET device 410 and evaluation node "N" evaluates. The assertion of logic signal 408 also turns on NFET device 413, and turns off PFET device 414, thereby turning off NFET device 409. Output 405 then assumes a logic value that is the inverse, or logic complement, of the logic value of evaluation node "N".

If evaluation node "N" evaluates "high", then output 405 has a "low" logic value, and output 405 is held in a "low" logic state by NFET device 407 which is turned on by the logic signal at its gate. As previously discussed in conjunction with FIGS. 2 and 3, the width of NFET device 407 may be such that it satisfies the noise constraint described hereinabove. When evaluation node "N" evaluates "high", and output 405 is "low", the half latch formed by PFET device 412 turns on, latching evaluation node "N" "high".

Conversely, when evaluation node "N" evaluates "low", NFET device 407 turns off. PFET device 406 turns on, coupling output 405 to a voltage source. NFET device 409 is turned off by virtue of pseudo-clocked dynamic logic 400 having logic signal 408 asserted.

When logic signal 408 is negated, evaluation node "N" pre-charges. PFET device 410 is turned on coupling evaluation node "N" to a voltage supply, thereby pre-charging the evaluation node. The logical value output by N-tree logic 401 in response to inputs 402–404 and 408 is, preferably, complementary to the voltage supply, in order that large currents are not drawn by N-tree logic 401. NFET device 411 also turns on in response to node "N" being coupled to a voltage supply. However, output 405 primarily is reset through the action of NFET device 409.

The reset time of output 405, according to the principles of the present invention, may be primarily established through NFET device 409. The negation of logic signal 408 turns off NFET device 413 and turns on PFET device 414, coupling their common node "R" to a voltage supply, thereby turning on NFET device 409. Hence, output 405 is coupled to ground through NFET device 409 in response to the negation of logic signal 408. In this way, the reset of output 405 is decoupled from the reset of evaluation node "N". The reset time of output 405 may be set by the combination of the widths of NFET device 407 and NFET device 409. The width of NFET device 407 may be such as to satisfy the noise constraint, previously discussed in conjunction with FIGS. 2 and 3, without becoming so large as to slow down the reset of node "N". The width of NFET device 409 may then be established by the required reset time of output 405.

Figure 5:
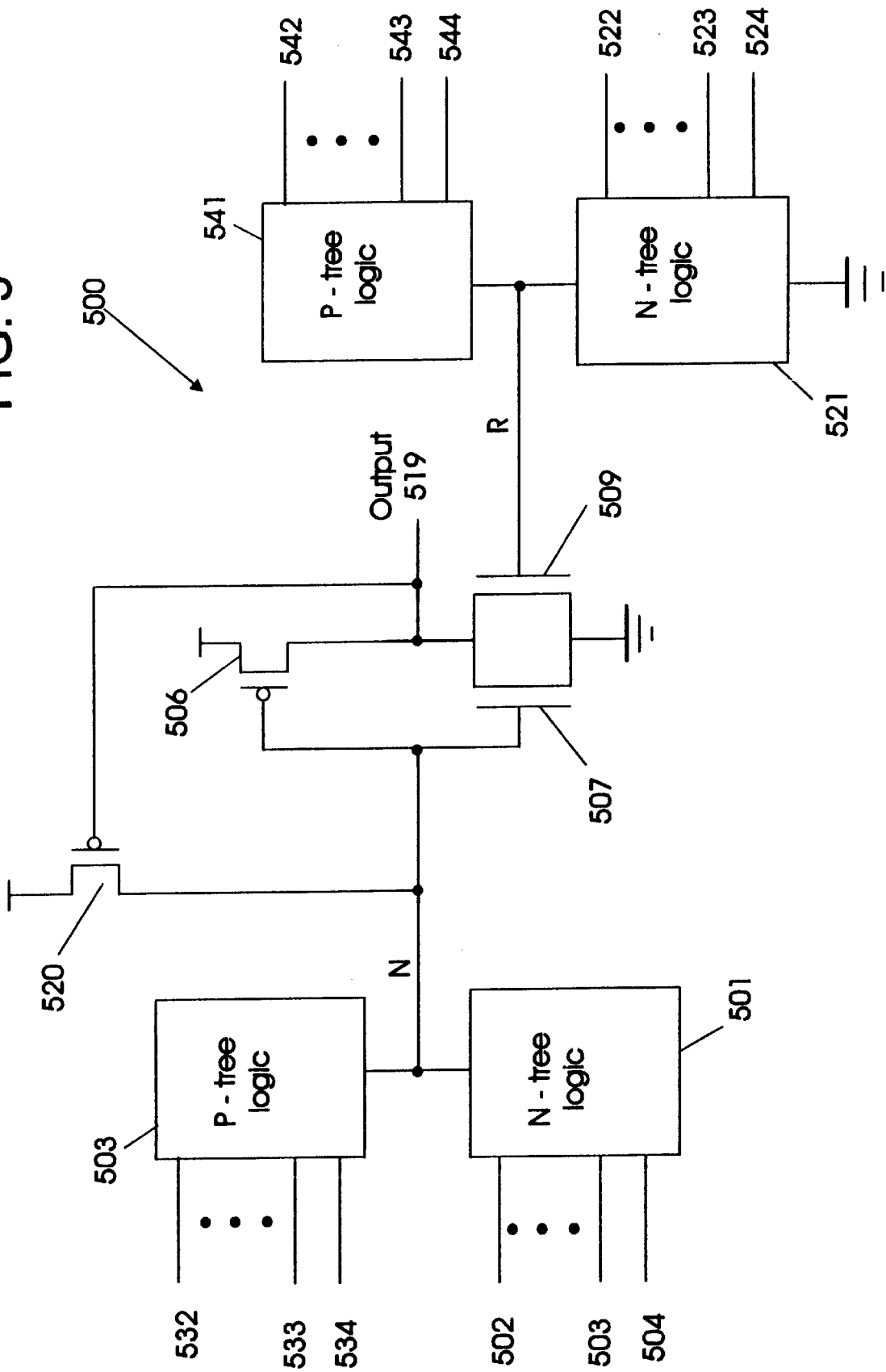
FIG. 5 illustrates, in partial schematic form, a dynamic logic circuit in accordance with another alternative embodiment of the present invention.

Refer now to FIG. 5 in which is illustrated an alternative embodiment of a pseudo-clocked type dynamic logic according to the principles of the present invention. Dynamic logic circuit 500 includes two N-tree logic circuits, 501 and 521, and two P-tree logic circuits 531 and 541. Each of N-tree logic circuits 501 and 521 include an N-tree stack having a plurality of NFET devices (not shown in FIG. 5), and P-tree logic circuits 531 and 541 each include a P-tree stack having a plurality of PFET devices (not shown in FIG. 5). N-tree logic circuit 501 generates a logical output signal in response to a plurality of inputs 502–504. Similarly, N-tree logic circuit 521 and P-tree logic circuits 531 and 541 generate a corresponding logical output signal in response to a plurality of inputs 522–524, 532–534, and 542–544, respectively.

Evaluation node, "N", is formed by a junction of the output of N-tree logic circuit 501 and P-tree logic circuit 531. A "foot" node of N-tree logic circuit 501 is coupled to ground and a "head" node of P-tree logic circuit 531 is coupled to a voltage supply.

The logic signal on evaluation node "N" is inverted by a series connected pair of transistors, PFET device 506 and NFET device 507. Evaluation node "N" is coupled to a gate of each of these devices. A drain of PFET device 506 is coupled to a voltage supply and the source of PFET device 506 is coupled to a drain of NFET device 507. A source of NFET device 507 is connected to ground. Output 505 of dynamic logic circuit 500 is formed by the junction of the source of PFET device 506 and the drain of NFET device 507. Output 505 is also coupled to a gate of a half-latch, PFET device 512, which latches evaluation node "N" when it evaluates "high." A drain of PFET device 512 is coupled to a voltage supply, and its source is coupled to evaluation node "N".

Reset of output 505 is effected via NFET device 509. The output of N-tree logic circuit 521 and P-tree logic circuit 541 are coupled to form node "R" that is further coupled to a gate of NFET device 509. Output 505 is reset when the output of P-tree logic circuit 541 is asserted in response to input signals 542–544, and the output of N-tree logic circuit 521 is decoupled from ground in response to input signals 522–524. When the output of P-tree logic circuit 541 is asserted, node "R" is coupled to a voltage supply, and NFET device 509 is turned on, thereby, resetting output 505. The reset time of output 505 may be established primarily by the width of NFET device 509, with the width of NFET device 507 such as to satisfy noise requirements, as previously discussed in conjunction with FIGS. 2 and 3. Thus, reset of output 505 is decoupled from reset of evaluation node "N".

Evaluation node "N" resets by the output of P-tree logic circuit 531. When the output of P-tree logic circuit 531 is asserted in response to signals 532–534, evaluation node "N" is pre-charged. During pre-charge of node "N", the output of N-tree logic circuit 501 is decoupled from ground in response to signals 502–504.

Conversely, during evaluation, the output of P-tree logic circuit 541 is decoupled from a voltage supply and the output of N-tree logic circuit 521 is asserted. Node "R" is thereby coupled to ground, and NFET device 509 turns off.

Output 505 assumes a logic value determined, in response to inputs 502–504, by the output of N-tree logic 501 appearing on evaluation node "N".

Figure 6:
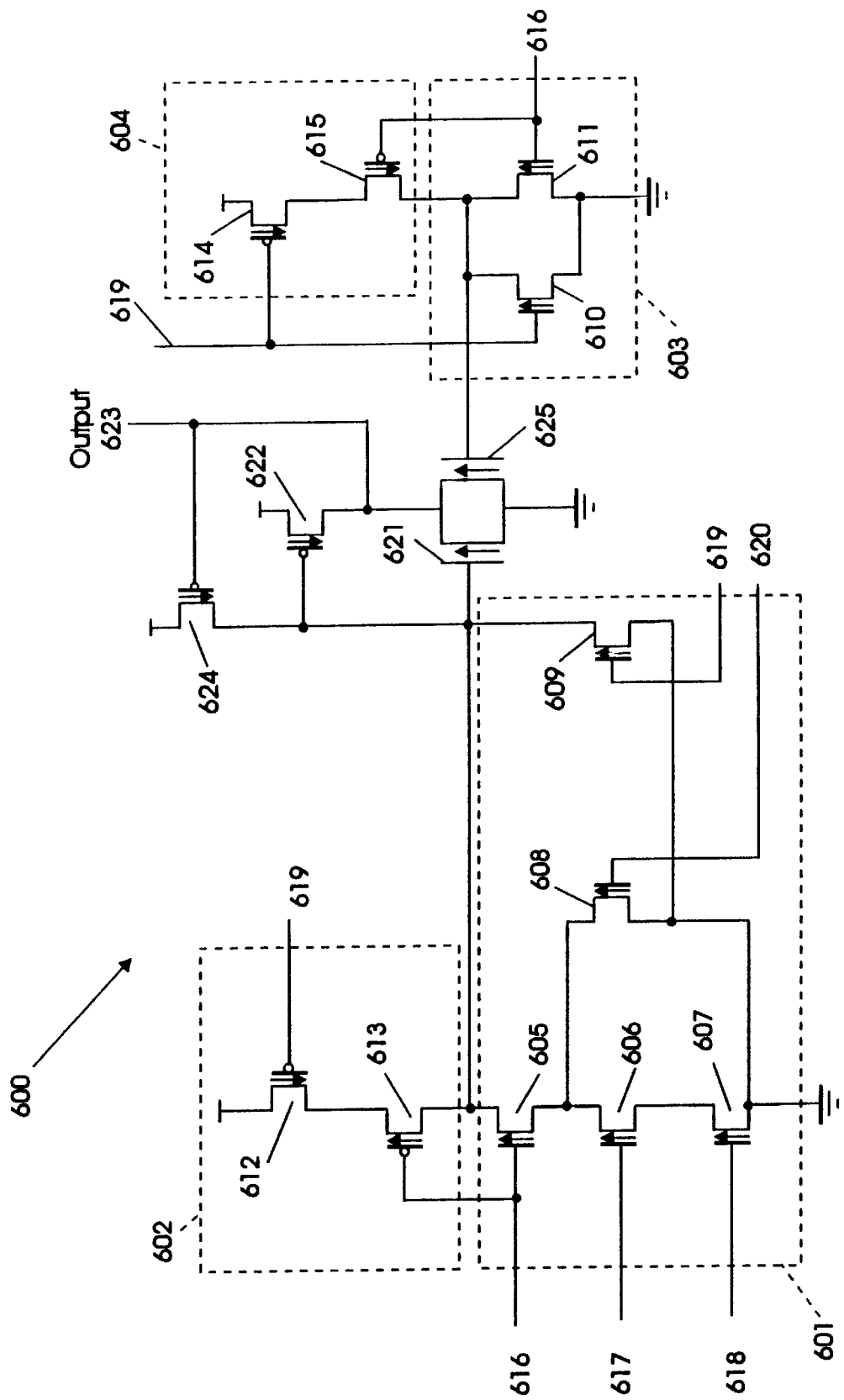
FIG. 6 illustrates, in partial schematic form, a dynamic logic circuit in accordance with another alternative embodiment of the present invention.

Pseudo-clocked dynamic logic according to the present invention may be better understood by referring now to FIG. 6, in which an example of a pseudo-clocked dynamic logic circuit, dynamic logic circuit 600, is illustrated. Dynamic logic circuit 600 includes N-tree logic circuits 601 and 603, and P-tree logic circuits 602 and 604. N-tree logic circuit 601 contains an N-tree stack having a plurality of NFET devices, 605–609. An N-tree stack including NFET devices 610 and 611 is contained in N-tree logic circuit 603. P-tree logic circuit 602 includes a P-tree stack containing PFET device 612 and PFET device 613, and P-tree logic circuit 604 includes a P-tree stack comprising PFET devices 614 and 615.

A plurality of logic signals are input to dynamic logic circuit 600. Inputs 616–620 are provided to N-tree logic circuit 601, wherein each input is coupled to a corresponding gate of NFET devices 605–609. Input 616 is also coupled to P-tree logic circuit 602 at a gate of PFET device 613. P-tree logic 602 also receives input 619 at a gate of PFET device 612. Inputs 616 and 619 are also coupled to N-tree-logic circuit 603 at gates of NFET devices 611 and 610, respectively, and to P-tree logic circuit 604 at gates of PFET devices 615 and 614, respectively.

Evaluation node "N" is formed from the junction of an output of P-tree logic circuit 602 and N-tree logic circuit 601. Node "N" is coupled to a gate of NFET device 621 and a gate PFET device 622. NFET device 621 and PFET device 622 are connected in series, with a drain of PFET device 622 connected to a voltage source and a source of NFET device 621 coupled to ground. A common junction of a source of PFET device 622 and a drain of NFET device 621 forms output 623 of dynamic logic circuit 600. PFET device 624 is a half-latch, latching node "N" when it evaluates "high." A drain of PFET device 624 is coupled to a voltage source, and its source is coupled to node "N".

Node "N" is pre-charged when inputs 616 and 619 are negated. These turn on PFET devices 613 and 612 in P-tree logic circuit 602, respectively, coupling node "N" to a voltage supply. These inputs also decouple the output of N-tree logic 601 from ground by turning off NFET devices 605 and 609, respectively. During pre-charge of node "N", output 623 is also reset.

Reset of output 623 is effected by the operation of P-tree logic 604 and N-tree logic 603. Outputs of N-tree logic 603 and P-tree logic 604 are coupled to form node "R". Node "R" is further coupled to a gate of NFET device 625, a drain of which is coupled to output 623. A source of NFET device 625 is coupled to ground. When inputs 616 and 619 are negated, PFET devices 615 and 614 in P-tree logic circuit 604, respectively, are turned on, asserting the output of P-tree logic circuit 604. The output of N-tree logic is decoupled from ground as inputs 616 and 619 turn off NFET devices 611 and 610, respectively. With node "R" thereby coupled to a voltage supply, NFET device 625 turns on, resetting output 623.

Conversely, dynamic logic circuit 600 evaluates when either input 616, 619 or both are asserted. Asserting either input 616, input 619, or both decouples the output of P-tree logic circuit 602 and P-tree logic circuit 604 from the voltage supply by turning off at least one of PFET devices 612 and 613 in P-tree logic circuit 602, and at least one of PFET devices 614 and 615 in P-tree logic circuit 604. The output of N-tree logic 603 is asserted in response to at least one of NFET devices 610 and 611 turning on, coupling node "R" to ground. NFET device 625 is thereby turned off, and output 623 assumes a logic state determined by the output of N-tree logic circuit 601, appearing at evaluation node "N".

The principles of the present invention may be incorporated in dynamic logic types having other inverting logic circuitry forming its output stage. Embodiments of the present invention, shown in FIGS. 2–6, are described as having an inverter output stage, such as output stage 626 in FIG. 6. However, a decoupled reset dynamic logic circuit, according to the present invention, may incorporate other inverting logic output stage types.

Figure 7:
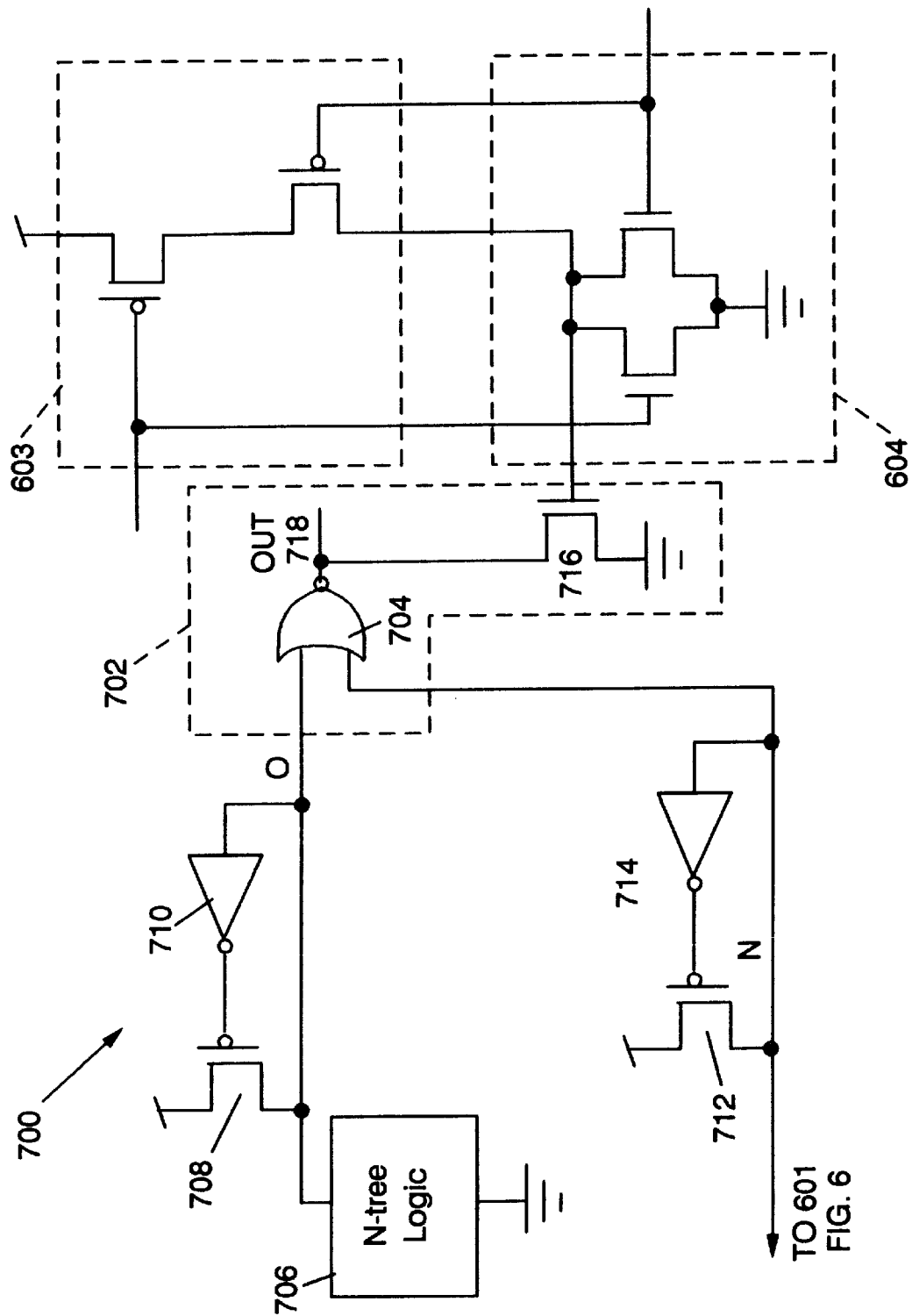
FIG. 7 illustrates, in partial schematic form, a dynamic logic circuit in accordance with another alternative embodiment of the present invention.

FIG. 7 illustrates an embodiment of a pseudo-clocked decoupled reset dynamic logic circuit 700 in which output stage 702 includes NOR gate 704 forming the logic "NOR" of the signal on node "N" from the N-tree logic circuit 601 (not shown in FIG. 7) and the signal on node "O" of a second N-tree logic circuit 706. The combination of PFET 708 and inverter 710, and the combination of PFET 712 and inverter 714 form half latches, latching their respective nodes "O" and "N".

NFET 716 resets output 718. A gate of NFET 716 is coupled to the common junction of the output of P-tree logic 604 and the output of N-tree logic 603, and resets output 722 in the same fashion as NFET 625 described in conjunction with FIG. 6.

Although output stage 702 has been shown in association with pseudo-clocked decoupled reset dynamic logic 700, it would be understood by one of ordinary skill in the art that output stage 702 may be incorporated in decoupled dynamic logic circuitry of other types, such as footed type decoupled reset dynamic logic 200 in FIG. 2, and delayed-reset decoupled reset dynamic logic 300 in FIG. 3.

Figure 8:
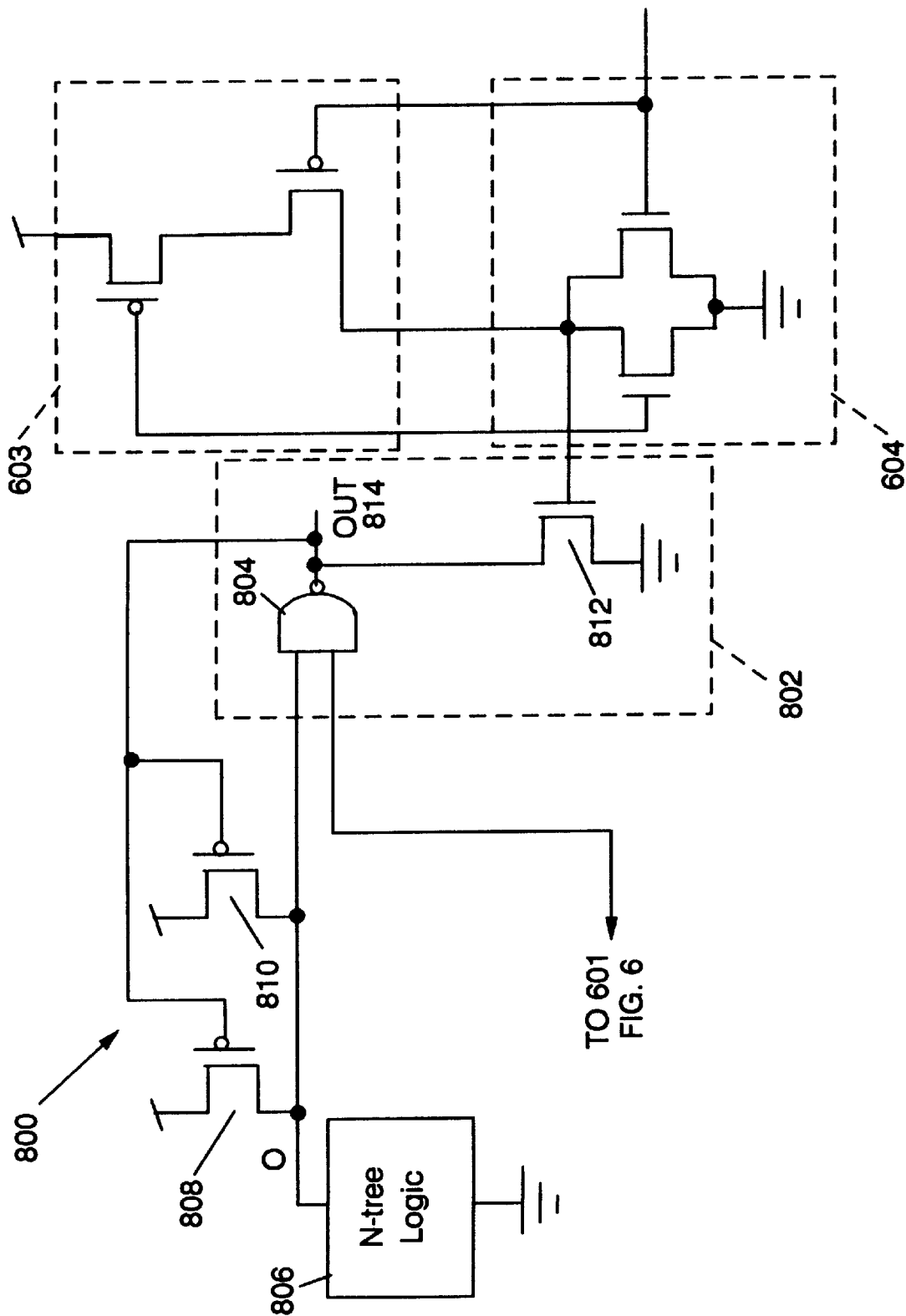
FIG. 8 illustrates, in partial schematic form, a dynamic logic circuit in accordance with another alternative embodiment of the present invention.

FIG. 8 illustrates an embodiment of a pseudo-clocked dynamic logic circuit 800 having an output stage 802 including an NAND gate 804, forming the logical "NAND" of the signals on nodes "N" and "O". The signal on node "N" is received from N-tree logic circuit 601 (not shown in FIG. 7) and the signal on node "O" is output by N-tree logic circuit 806. PFETs 808 and 810 form half latches latching nodes "O" and "N", respectively.

NFET 812 resets output 814. A gate of NFET 812 is coupled to the common junction of the output of P-tree logic 604 and the output of N-tree logic 603, and resets output 814 in the same fashion as NFET 625 described in conjunction with FIG. 6.

Although output stage 802 has been shown incorporated in pseudo-clocked decoupled reset dynamic logic 800, it would be understood by one of ordinary skill in the art that output stage 802 may be included in other decoupled dynamic logic types, such as footed type decoupled reset dynamic logic 200 in FIG. 2, and delayed-reset decoupled reset dynamic logic 300 in FIG. 3.

Although the present invention and its advantages have been described in detail, it should be understood that various changes, substitutions and alterations can be made herein without departing from the spirit and scope of the invention as defined by the appended claims.

What is claimed is:

1. A dynamic logic circuit comprising:
   a first N-tree logic circuit adapted for receiving a first plurality of logical input signals and generating an output in response thereto;
   a first P-tree logic circuit adapted for receiving a second plurality of logical input signals and generating an output in response thereto, said first P-tree logic circuit having an output coupled to said output of said first N-tree logic circuit;

a p-type field effect transistor (PFET) device having a gate coupled to said output of said first N-tree and P-tree logic circuits, and a drain coupled to a first voltage supply;

an first n-type field effect transistor (NFET) device having a drain coupled to a source of said PFET device, and a source coupled to a second voltage supply;

a second N-tree logic circuit adapted for receiving a third plurality of third logical input signals and generating an output in response thereto, said output of said second N-tree logic circuit being coupled to a gate of said first NFET device; and a second P-tree logic circuit adapted for receiving a fourth plurality of logical input signals and generating an output in response thereto, said output being coupled to said gate of said first NFET, and wherein said output of said second N-tree logic circuit and said second P-tree logic circuit are operable for resetting said output of said dynamic logic circuit.

2. The dynamic logic circuit of claim 1 wherein said first N-tree logic circuit includes a first plurality of NFET devices, said second N-tree logic circuit includes at least one second NFET device, said first P-tree logic circuit includes at least one second PFET device, and said second P-tree logic circuit includes at least one third PFET device.

3. The dynamic logic circuit of claim 1 further comprising a second NFET device having source and drain coupled in parallel with said source and drain of said first NFET device, and having a gate coupled to said outputs of said first N-tree and first P-tree logic circuits.

4. The dynamic logic circuit of claim 2 wherein said first plurality NFET devices comprises:

a second NFET device having a drain coupled to said output of said first N-tree logic circuit, an a gate adapted for receiving a first logical signal of said first plurality of logical signals;

a third NFET device having a drain coupled to a source of said second NFET device, and a gate adapted for receiving a second logical signal of said first plurality of logical signals;

a fourth NFET device having a drain coupled to a source of said third NFET device, a source coupled to said second voltage supply, and a gate adapted for receiving a third logical signal of said first plurality of logical signals;

a fifth NFET device having a drain coupled to said drain of said third NFET device and said source of said second NFET device, a source coupled to said second voltage supply, and a gate adapted for receiving a fourth logical signal of said first plurality of logical signals; and a sixth NFET device having a drain coupled to said output of said first N-tree logic circuit, a source coupled to said second voltage supply, and a gate adapted for receiving a fifth logical signal of said first plurality of logical signals.

5. The dynamic logic circuit of claim 2 wherein said at least one second PFET device comprises:

a second PFET device having a drain coupled to said first voltage supply; and a third PFET device having a drain coupled to a source of said second PFET device, and a source coupled to said output of said first P-tree logic circuit.

6. The dynamic logic circuit of claim 2 wherein said at least one second NFET device comprises:

a second NFET device; and a third NFET device, wherein drains of said second and third NFET devices are coupled in parallel to said output of said second N-tree logic circuit, and wherein sources of said second and third NFET devices are coupled in parallel to said second voltage supply.

7. The dynamic logic circuit of claim 2 wherein said at least one third PFET device comprises:

a third PFET device having a drain coupled to said first voltage supply; and a fourth PFET device having a drain coupled to a source of said third PFET device, and a source coupled to said output of said second P-tree logic circuit.

8. The dynamic logic circuit of claim 1 further comprising a second PFET device having a gate coupled to said output of said dynamic logic circuit, a drain coupled to said first voltage supply, and a source coupled to said outputs of said first N-tree and first P-tree logic circuits.

9. The dynamic logic circuit of claim 1 wherein said first NFET has a size determined by a noise threshold value of a subsequent logic stage coupled to said output of said dynamic logic circuit.

10. The dynamic logic circuit of claim 3 wherein said second NFET has a size determined by a reset time of said dynamic logic circuit.

11. The dynamic logic circuit of claim 3 wherein said first NFET has a size determined by a noise threshold value of a subsequent logic stage coupled to said output of said dynamic logic circuit and said second NFET has a size determined by a reset time of said dynamic logic circuit.

* * * * *